United States Patent [19]
Yamashita et al.

[11] Patent Number: 5,396,198
[45] Date of Patent: Mar. 7, 1995

[54] ELECTRONIC CIRCUIT DEVICE HAVING A SERIES CONNECTION OF RESISTOR AND CAPACITANCE AS A NOISE REDUCING CIRCUIT CONNECTED TO A POWER SOURCE WIRING

[75] Inventors: Hiroki Yamashita, Hachioji; Hiroyuki Itoh, Akigawa; Keiichirou Nakanishi, Tokyo; Tatsuya Saitoh, Kokubunji; Tohru Kobayashi, Iruma; Satoru Isomura, Ome, all of Japan

[73] Assignee: Hitachi, Ltd., Tokyo, Japan

[21] Appl. No.: 118,178

[22] Filed: Sep. 9, 1993

[30] Foreign Application Priority Data

Sep. 9, 1992 [JP] Japan .................... 4-240332

[51] Int. Cl.6 .................... H01P 5/12; H01P 1/26
[52] U.S. Cl. .................... 333/136; 333/22 R; 333/20
[58] Field of Search ............... 333/14, 22 R, 167, 168, 333/136, 172, 175, 181, 184, 20, 12; 307/465.1; 257/532, 533, 535, 536

[56] References Cited

U.S. PATENT DOCUMENTS

| 2,942,195 | 6/1960 | Dean | 333/168 X |
| 3,120,647 | 2/1964 | Bravenec | 333/172 X |
| 4,228,369 | 10/1980 | Anantha et al. | 333/22 R X |
| 4,794,353 | 12/1988 | Broyde | 333/168 X |
| 4,866,502 | 9/1989 | Tomaszewski et al. | 257/533 |
| 5,208,562 | 5/1993 | Schirm, IV | 333/22 R |

FOREIGN PATENT DOCUMENTS 2148845  6/1990  Japan .................... 257/533

*Primary Examiner*—Seungsook Ham
*Attorney, Agent, or Firm*—Antonelli, Terry, Stout & Kraus

[57] ABSTRACT

A power source wiring supplies power to individual electronic circuits constituting an electronic circuit device. Load circuits are connected to the power source wiring within the range of an arrival time of a voltage noise occurring in the power source wiring in a time of about a half of a pulse width of a noise current at the time of the operation of the electronic circuit. Each of these load circuits includes a series circuit of a resistance and a capacitance.

5 Claims, 8 Drawing Sheets

ELECTRONIC CIRCUIT DEVICE HAVING A SERIES CONNECTION OF RESISTOR AND CAPACITANCE AS A NOISE REDUCING CIRCUIT CONNECTED TO A POWER SOURCE WIRING

BACKGROUND OF THE INVENTION

This invention relates to a power source wiring system in an electronic circuit device comprising a plurality of electronic circuits. More particularly, the present invention relates to a noise reduction structure for reducing a voltage noise on a power source wiring resulting from a current noise that occurs as a result of operation of an electronic circuit.

In electronic circuit devices comprising a plurality of electronic circuits such as electronic computers, a higher integration density has been sought in recent years with a higher operation speed of individual electronic circuits so as to improve processing speed and obtain reduction in size.

A current noise (an a.c.-like noise current) flows through a power source wiring for feeding power to electronic circuits with the operation of the electronic circuits, and this noise current generates a voltage noise in the power source wiring system. The resulting voltage noise changes the power source voltage of a group of electronic circuits in the vicinity of the electronic circuit in which the current noise occurs, and invites an erroneous operation of these electronic circuits.

SUMMARY OF THE INVENTION

A higher operation speed of the electronic circuits and a higher integration density of the electronic circuit device drastically increase the quantity of the noise current due to a noise current quantity per electronic circuit (a peak value of the noise current) with the higher operation speed, and due to a noise source (electronic circuit) itself with a higher integration density. Because a propagation speed of the noise is constant, the higher integration density invites expansion of a range of the noise influence.

Accordingly, reduction of the power source noise and prevention of noise propagation become very important in light of the higher operation speed of electronic circuits and the higher integration density of the electronic circuit device which is expected in future.

It is an object of the present invention to provide a structure of a power source wiring system which reduces a voltage noise occurring in the power source wiring system due to a current noise at the time of the operation of an electronic circuit particularly in an electronic circuit device having electronic circuits mounted thereto in a high integration density, and to prevent propagation of the voltage noise.

To accomplish the object described above, an electronic circuit device according to the present invention includes load circuits for reducing noise, connected to power source wirings between junctions of two electronic circuits and the power source wirings.

Each of the load circuits comprises a series circuit of a resistor element and a capacitance element connected between the power source wiring and a ground potential.

The relation between the resistance value RL of the resistance element and the capacitance value CL of the capacitance element is set as follows, by assuming the operation frequency of the electronic circuit as $f_o$:

(1) When noise reaches the distal end of the power source wiring with a time which is $\frac{1}{8}$ of the cycle of the operation frequency $f_o$:

$$CL > k^2/(2 \cdot \pi \cdot f_o \cdot \sqrt{Lt \cdot L \cdot N})^2 \tag{1}$$

where k is set to 1.4;

(2) When noise reaches only a distance Le of the power source wiring with the time of $\frac{1}{8}$ of the cycle of the operation frequency $f_o$:

$$CL > k_2 \cdot 2/(\pi^2 \cdot ZO \cdot Ne \cdot f_o) \tag{2}$$

where k is set to 1.4;

(3) When noise reaches the distal end of the power source wiring with the time of $\frac{1}{8}$ of the cycle of the operation frequency $f_o$, the value k in the formula (1) is set to 1.0 and the load resistance RL is set as follows:

$$CL \cdot RL^2 > Lt \cdot L \cdot N \tag{3}$$

or, when noise reaches only the distance Le of the power source wiring with the time of $\frac{1}{8}$ of the cycle of the operation frequency $f_o$, the value k in the formula (2) is set to 1.0 and the load resistance RL is set as follows:

$$RL > \pi \cdot ZO \cdot Ne/4 \tag{4}$$

Here, Le is the distance which the noise can reach with the time of $\frac{1}{8}$ of the cycle of the operation frequency f, and is expressed by the following formula:

$$Le = 1/(8 \cdot f \cdot \sqrt{(L \cdot C)}) \tag{5}$$

Further, Lt is the wiring length of the power source wiring, L and C are the inductance and the capacitance per unit length of the power source wiring, CL is the capacitance of the load circuit, N is the number of load circuits, and Ne is the total number of load circuits disposed within the distance Le from the noise occurring point.

As a result, the voltage noise is damped whenever it passes through the load point, and the influences of the voltage noise on other electronic circuits can be reduced.

Particularly when the load circuit is disposed within the range of the power source wiring in which the noise propagates within the time of $\frac{1}{2}$ of a pulse width of the voltage noise occurring from the junction between the power source circuit and the electronic circuit with the operation of the electronic circuit, a reflection wave occurring at this load point propagates towards the noise generation point and offsets the voltage noise at the noise generation point. Accordingly, the voltage noise at the noise generation point can be reduced.

DESCRIPTION OF THE PREFERRED EMBODIMENTS

Figure 1A:
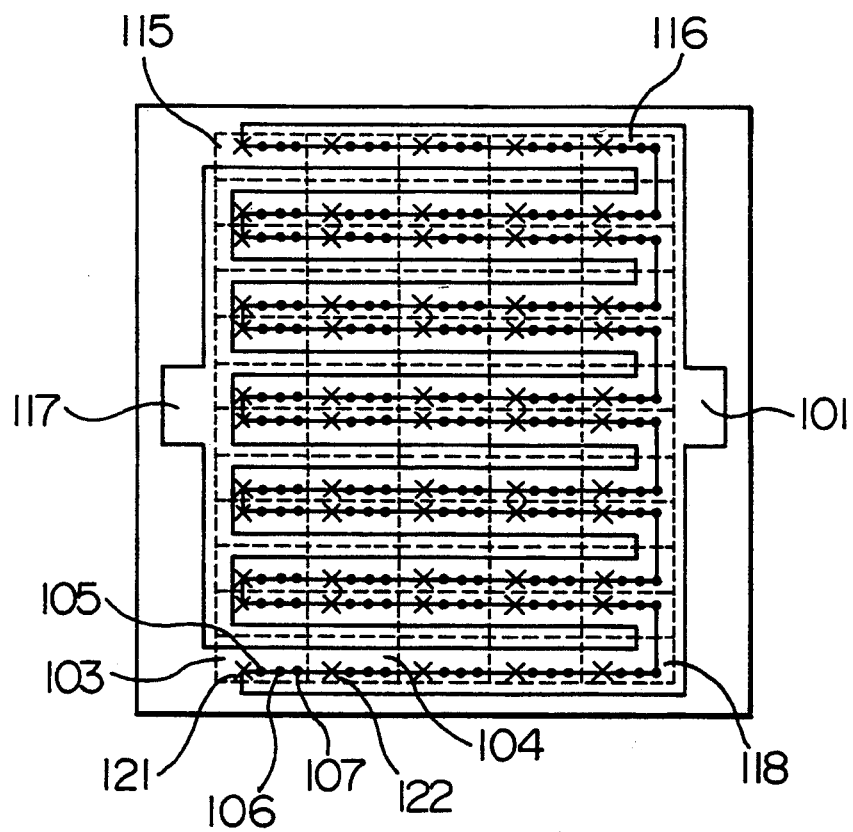
FIG. 1A is a planar structural view of power source wirings of a semiconductor integrated circuit chip to which a noise reduction structure of the present invention is applied.
Figure 1B:
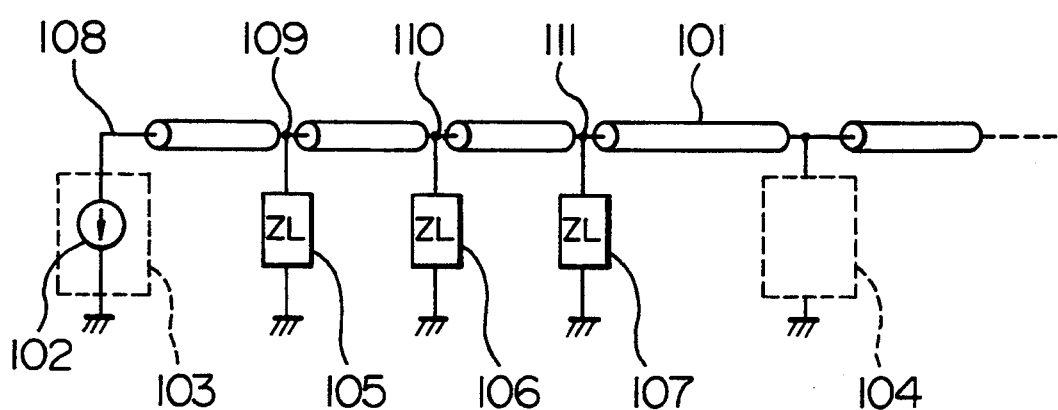
FIG. 1B is an electric equivalent circuit diagram of a part of the power source wiring shown in FIG. 1A.

FIGS. 1A and 1B are structural views each showing a noise reduction structure according to an embodiment of the present invention.

FIG. 1A illustrates a planar structure of a power source wiring of a semiconductor integrated circuit chip to which a noise reduction structure according to the present invention is applied. This chip represents a structural example of a master slice type semiconductor integrated circuit having electronic circuits which are regularly arranged on a semiconductor substrate. Reference numerals 117 and 101 denote power source wirings, respectively. Reference numeral 117 denotes a power source wiring of a ground potential, which is electrically connected to the substrate inside the semiconductor integrated circuit chip or inside a package for mounting the semiconductor integrated circuit chip. Portions encompassed by dash lines, such as portions 103, 104 and 115, represent the electronic circuits. Symbol x, e.g. 121 and 122, denote feeding points at which a voltage is supplied to the electronic circuits 103 and 104. Black circles, e.g. 105, 106, 107 and 116, denote load circuits. Each load circuit is interposed between the feeding points of the electronic circuits adjacent to one another on the same power source wiring so as to prevent the propagation of a power source noise. For example, the load circuits 105, 106, 107 are disposed between the feeding points 121 and 122 in order to prevent any fluctuation of the potential of the feeding points 121 when the electronic circuit 103 starts operating, or, in other words, to prevent the propagation of a voltage noise to the electronic circuit 104.

FIG. 1B shows an electric equivalent circuit for a part of the power source wiring system in FIG. 1A. The power source wiring 101 can be handled as a distributed constant line having a characteristic impedance, and in this embodiment, the characteristic impedance is set to ZO. Reference numerals 103 and 104 denote electronic circuits having various electric functions, and power is supplied to them through the power source wiring 101. Reference numerals 105, 106 and 107 denote the load circuits described already, which reduce the voltage noise resulting from the noise current that occurs due to the operation of the electronic circuits 103, 104.

Incidentally, FIG. 1B shows the case where the electronic circuit 103 operates and then the noise current occurs, and the generation source of the noise current is equivalently expressed by the current source 102. The load circuits 105, 106 and 107 are interposed between this electronic circuit 103 and the electronic circuit 104 adjacent to the former, on the power source wiring. A great effect of the noise reduction can be obtained by disposing the load circuits particularly within the range of the distance, in which the noise propagates within the time about ½ of the pulse width of the noise from the power feeding point 108 to the electronic circuit 103 as the noise source on the power source wiring, that is, within the travelling distance of the noise propagating through the power source wiring 101 within the time of about ½ of the noise pulse width.

Figure 2:
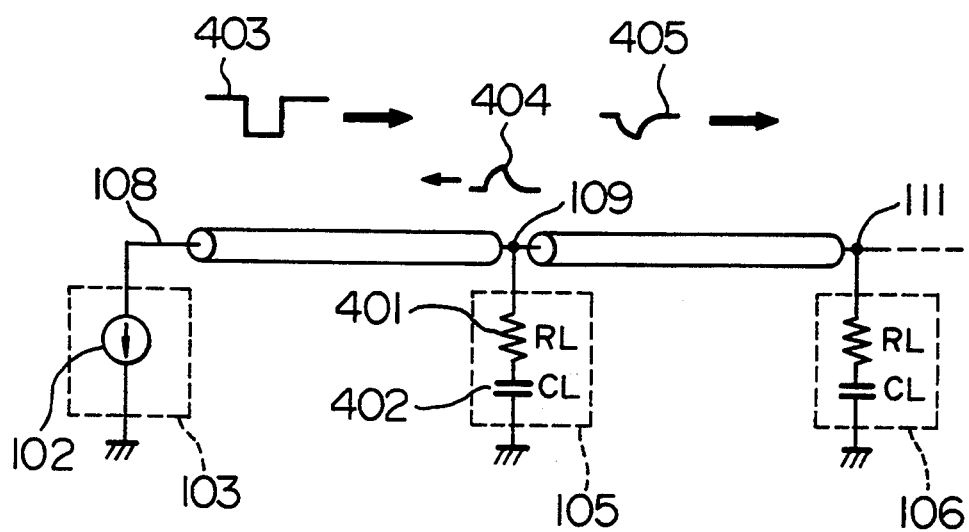
FIG. 2 is a structural view showing an embodiment wherein a load circuit of the noise reduction structure shown in FIG. 1A is constituted by a series circuit of a resistor and a capacitance.

As shown in FIG. 2, each of the load circuits 105, 106 and 107 can be constituted by a series circuit of a resistor and a capacitance.

Figure 5A:
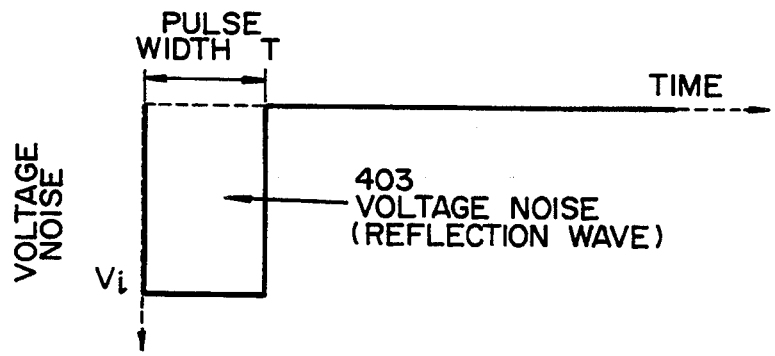
FIG. 5A is a diagram showing an initial noise waveform at an occurrence point of a voltage noise.
Figure 5B:
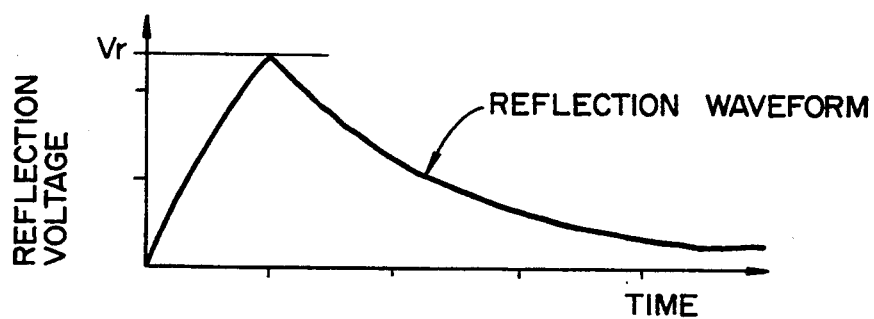
FIG. 5B is a diagram showing a reflection waveform when the voltage noise shown in FIG. 5A is incident into the load junction point.
Figure 6A:
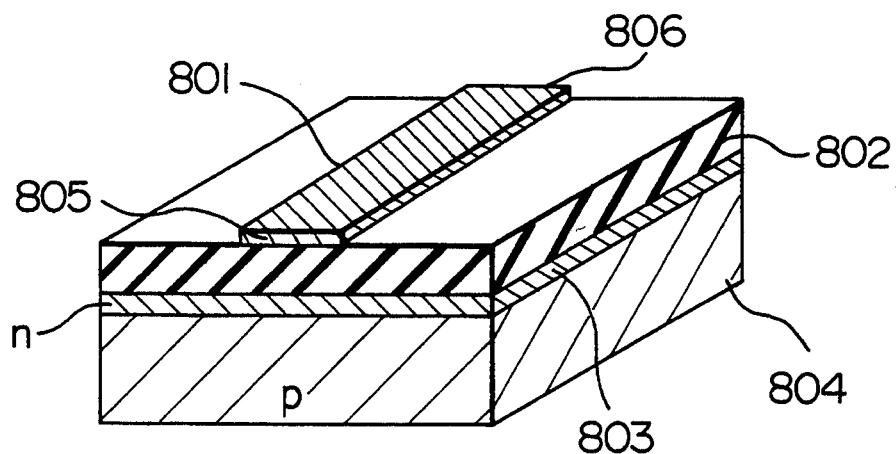
FIG. 6A is a perspective view showing the structure of the power source wiring on the semiconductor substrate.
Figure 6B:
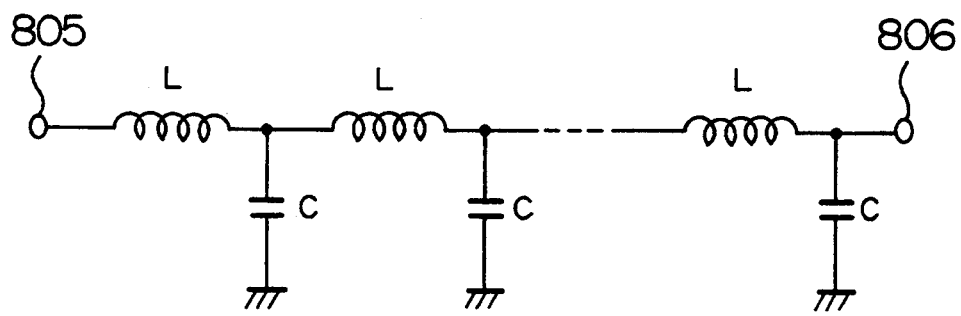
FIG. 6B is an equivalent circuit diagram of the power source wiring on the semiconductor substrate.
Figure 6C:
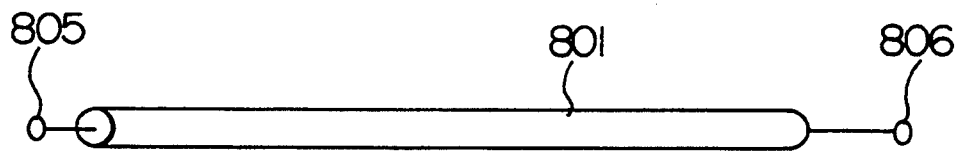
FIG. 6C is a schematic view showing the equivalent circuit of the power source wiring.

The power source wirings on the semiconductor integrated circuit chip are equivalently expressed as in FIG. 5, and are determined by the width of the power source wirings and the distance between the power source wiring 801 and the substrate 804, that is, the thickness of the dielectric, as shown in FIGS. 6A to 6C.

FIG. 6A shows the structure of the power source wiring, FIG. 6B does an equivalent circuit and FIG. 6C does symbols. The power source wiring is expressed as a distributed constant line comprising an inductance L per unit length and the capacitance C. Generally, the width of the power source wiring is increased so as to reduce its resistance component. Reference numeral 802 denotes $SiO_2$ as the dielectric and reference numeral 803 denotes an active layer in which transistors, etc, and formed and an iron implantation layer. The numeral 806 is made of Al, for example.

The relation of the characteristic impedance ZO, which represents electrical characteristics of the power source wiring at this time, or the propagation time tpd, with the inductance L and the capacitance C per unit length described already is expressed by the following formulas:

$$ZO = \sqrt{(L/C)} \tag{6}$$

$$tpd = \sqrt{(L \cdot C)} \qquad (7)$$

Figure 7A:
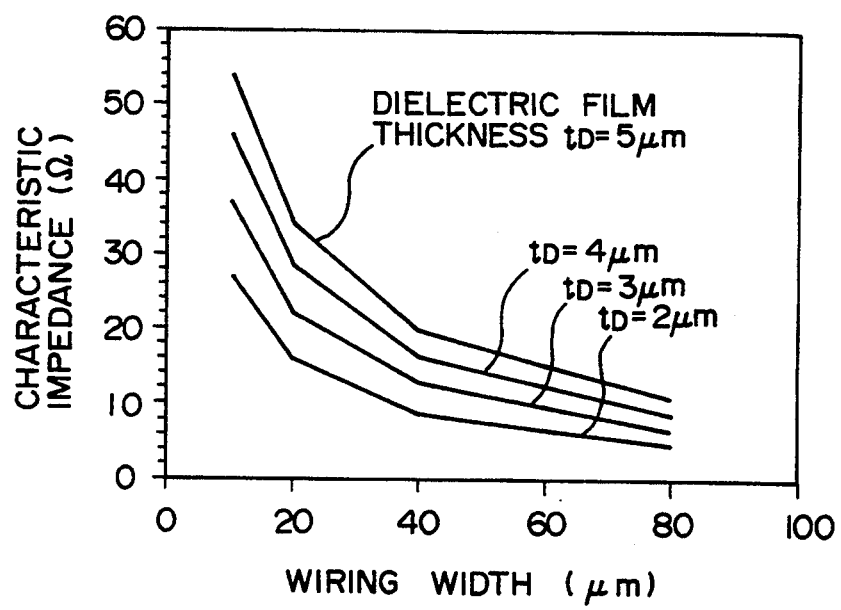
FIG. 7A is a diagram showing the relationship between a characteristic impedance of the power source wiring formed on the semiconductor substrate and a wiring width.
Figure 7B:
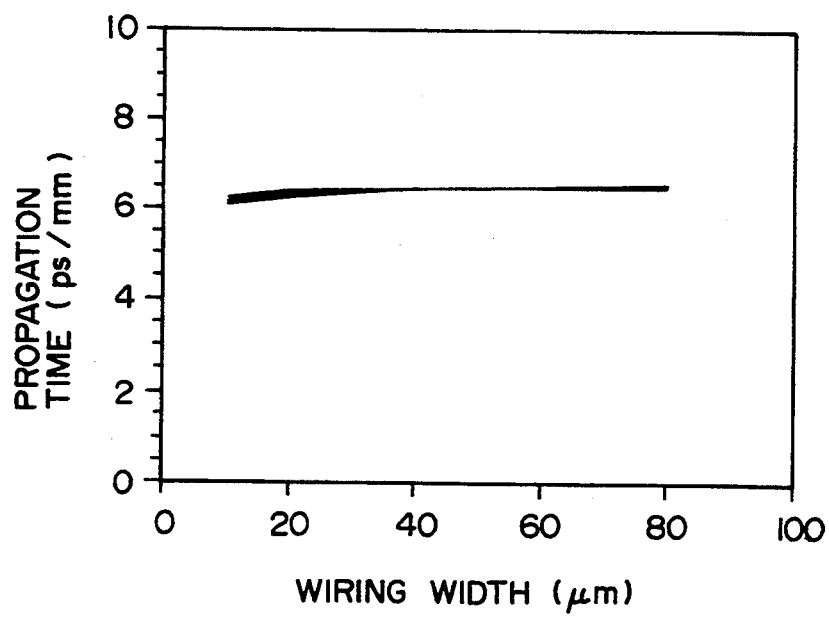
FIG. 7B is a diagram showing the relationship between a propagation time on the power source wiring formed on the semiconductor substrate and the wiring width.

FIG. 7A shows the characteristic impedance and FIG. 7B shows the propagation time. In FIG. 7A, thickness of the dielectric member may be defined as the distance between the wiring 801 and the substrate 804, for example.

When the noise current 102 flows due to the operation of the electronic circuit 103, the voltage noise 202 occurs at the noise generation point 108 as shown in the drawing. When this voltage noise 202 reaches the junction 109 of the first load circuit 105, a reflection wave 404 having an opposite polarity to this voltage noise occurs at this junction 109 due to mismatching of the impedance by the load circuit 105. This reflection wave 404 operates in such a direction as to offset the voltage noise 403, and the voltage noise at this point is reduced.

Figure 3A:
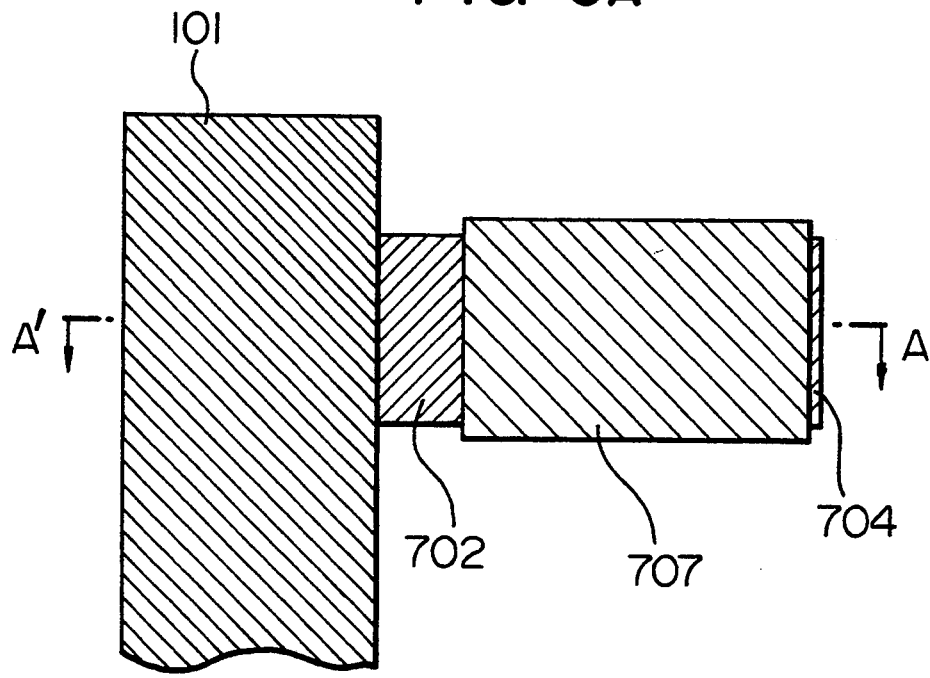
FIG. 3A is a plan view showing the series connection of a resistor element and a capacitance element formed on a semiconductor substrate according to the present invention.
Figure 3B:
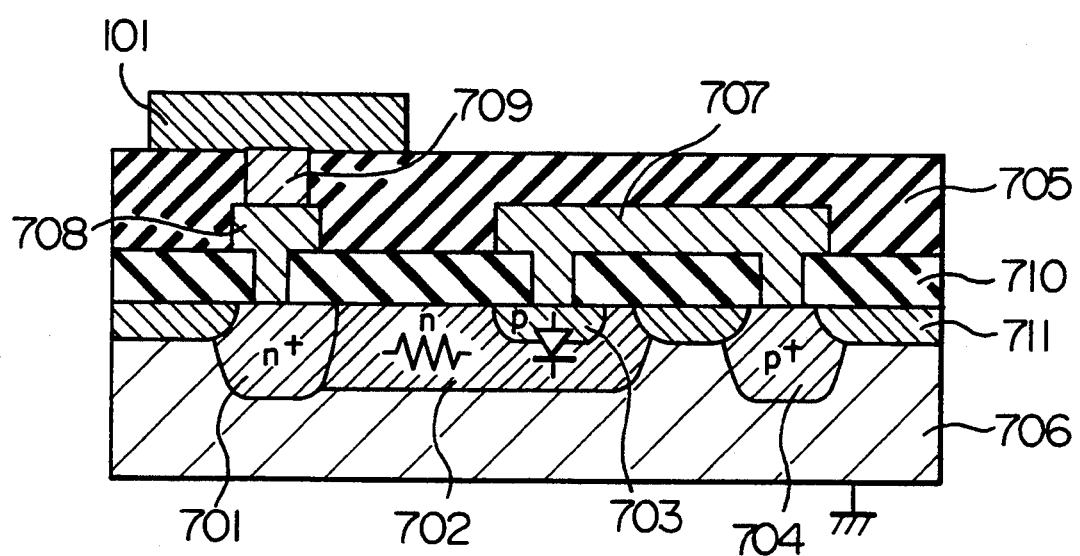
FIG. 3B is a structural sectional view of the series connection shown in FIG. 3A.

In other words, the reflection wave 404 reflects at this load point 109 towards the noise generation point, and the voltage noise 405 attenuated by the reflection wave 404 transmits. When this reflection wave 404 reaches the noise generation point 108 before the voltage noise 403 is extinguished at the noise generation point 108 (within the pulse width from the occurrence of the noise), the voltage noise at the noise point 108 is offset by this reflection wave 404, and the voltage noise 403 itself at the noise generation point 108 is reduced, too. In this embodiment, when the voltage noise 403 (the noise current) is a square wave as shown in FIG. 3A, for example, the reflection wave 404 at the load point 109 becomes such as shown in FIG. 3B. At this time, the peak value Vr of the reflection wave 402 is determined in accordance with the following equation:

$$Vr = Vi/(1 + 2 \cdot RL/ZO) \cdot EXP(-T/\beta) \qquad (8)$$

with the provision that a time constant $\beta$ is given by:

$$\beta = CL \cdot (ZO/2 + RL) \qquad (9)$$

Here, Vi is the peak value of the voltage noise 403, T is the pulse width of the voltage noise 403 (the noise current), RL is the resistance value of the resistance 401 of the load circuit 105, CL is the capacitance value of the capacitance 402 of the load circuit 105, and ZO is the characteristic impedance when the power source wiring is handled as the distributed constant line. As already described, a greater reduction effect of the voltage noise can be obtained by increasing the reflection wave 402. As can be understood from equations (8) and (9), the reflection wave 402 can be increased by making the time constant $\beta$ greater than the noise current pulse width T. Accordingly, a greater noise reduction effect can be obtained by increasing the capacitance value CL and the resistance value RL so as to increase the time constant. When the resistance value RL is excessively increased, however, the time contant $\beta$ can certainly be made greater, but the reflection wave becomes smaller because the term Vin/(1+2·RL/ZO) becomes smaller, so that the noise reduction effect cannot be obtained, on the contrary.

Next, the quantitative relation between the pulse width of the voltage noise (frequency component) described above, the inductance L and the capacitance C per unit length of the power source wiring, and the capacitance CL and the resistance value RL of the load circuit will be explained.

The following description will represent the case where the electronic circuit 103 operates and the voltage noise occurs at the feeding point 121 when the width of the power source wiring is 20 $\mu$m, the distance between the power source wiring and the substrate is 3 $\mu$m, the distance from the feeding point 121 to the branch point 118 is 10 mm, the gap between the load points is 1 mm and the total number of the load circuits is 10. To demonstrate the noise damping effect by the load circuits, the impedances of the electronic circuits 103 and so forth are hereby assumed to be infinite.

The frequency component of the noise occurring when the electronic circuit operates at the operation frequency $f_o$ exists in a frequency band within the range which is higher by one figure (= 10·$f_o$) than the operation frequency $f_o$. Therefore, there is the possibility that the noise of this frequency band propagates and causes an erroneous operation of the electronic circuit in the load circuit. In other words, the noise damping effect must be secured in the frequency range which is higher by one figure than the operation frequency $f_o$. Incidentally, in electronic circuit devices operating in synchronism with clock signals in general, the operation frequency is equal to the frequency of the clock signal.

Figure 8:
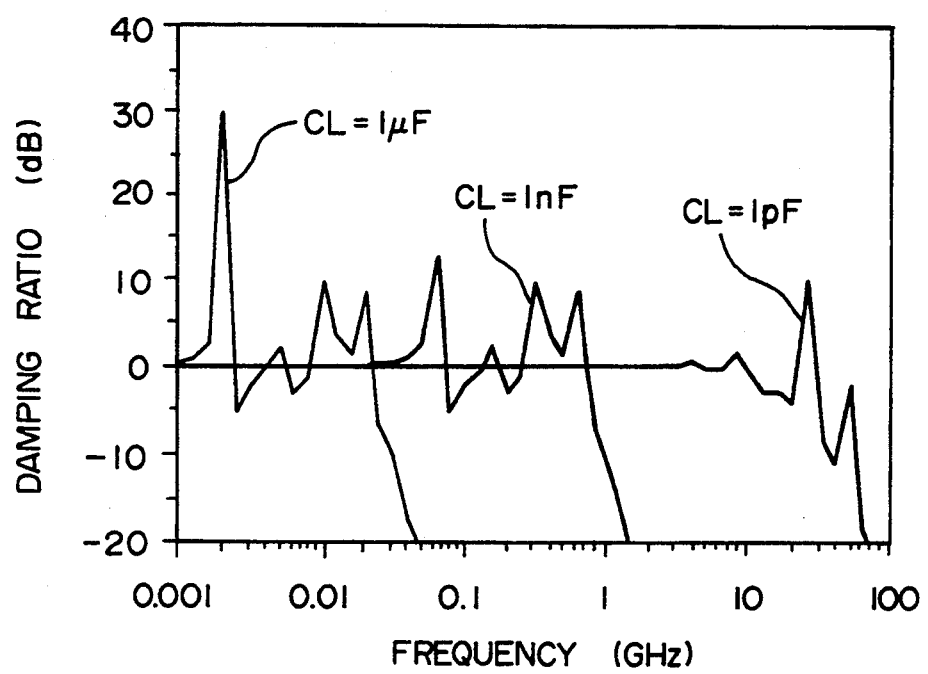
FIG. 8 is a diagram showing a noise damping ratio at a load junction when the resistance element of the load circuit does not exist.

FIG. 8 shows the noise damping ratio at the load point 105 using the capacitance value CL as a parameter about the case where the load circuit is not provided with the resistance element but is provided with the capacitance element alone. As can be understood from this diagram, the noise damping effect can be obtained by the use of the capacitance element alone with a frequency f$\alpha$, at which the noise frequency component exists, being a boundary. Accordingly, this boundary frequency f$\alpha$ must be set below the operation frequency $f_o$. This boundary frequency f$\alpha$ is approximately twice the resonance frequency by the total inductance (=Lp·L) and the total capacitance (=Lp·C+CL) of the power source wiring from the noise generation point to the load point, and is substantially expressed by the following formula:

$$f\alpha = 2/(2 \cdot \pi \cdot \sqrt{(Lp \cdot L \cdot (Lp \cdot C + CL))} \;) \qquad (10)$$

Here, Lp is the distance from the noise generation point to the load point, L is the inductance per unit length of the power source wiring, C is the capacitance per unit length of the power source wiring, and CL is the capacitance of the load circuit.

To obtain satisfactory damping characteristics to the noise of the frequency band higher by one figure than the operation frequency $f_o$ described above, therefore, it is necessary to increase the capacitance CL and to set the boundary frequency f$\alpha$ to be smaller than the operation frequency $f_o$, as can be appreciated from the formula (10), as well. When the operation frequency $f_o$ is 100 MHz, for example, a capacitance CL as great as dozens of nF becomes necessary to obtain the noise damping effect. In the integrated circuit chip formed on the semiconductor substrate, however, fabrication of such a large capacitance by the capacitances between parallel flat plates and by the junction capacitance shown in FIG. 3 requires an extremely large area and is not practical.

Figure 9A:
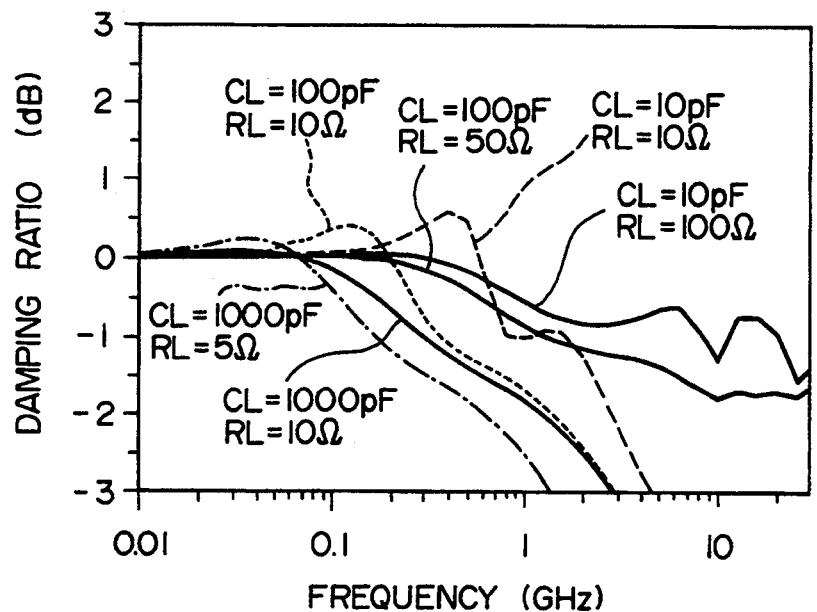
FIG. 9A is a diagram showing a noise damping ratio at a load junction when a load circuit comprises a series circuit of a resistance element and a capacitance element.

FIG. 9 shows the noise damping ratio at the load point 109 when the load circuit 105 is constituted by the series circuit of the capacitance element and the resistance element. As can be understood from FIG. 9A, the noise damping effect can be obtained when the load circuit comprising the series circuit of the capacitance element and the resistance element according to the present invention is used, too, with a certain frequency fα being the boundary. When the resistance RL of the load circuit is 5Q and its capacitance CL is 1,000 pF, for example, this boundary frequency fα is 66 MHz, and the noise damping effect can be obtained above this frequency. In this case, too, the noise of the frequency component, which renders the problem, can be damped by setting the boundary frequency fα below the operation frequency $f_o$. The noise damping effect can be obtained by using the capacitance, which is lower by one figure than when the capacitance element is used alone as described already, that is, 1,000 pF, in the operation frequency band. For, all the load circuits existing timewise before the peak-attaining time of the noise amplitude, or in other words, existing at those positions at which the reflection wave occurring at the load points returns to the noise generation point within the time of ¼ of the noise cycle, effectively function to reduce the noise. The range in which the load circuits are effective for damping the noise, that is, the distance Le in which the reflection wave occurring at the load point from the noise generation point returns to the noise generation point within the time of ¼ of the noise cycle, is determined by the following formula and depends on the operation frequency:

$$Le = 1/(8 \cdot f_o \cdot \sqrt{(L \cdot C)}) \tag{11}$$

Here, L and C are the inductance and the capacitance per unit length of the power source wiring, and $f_o$ is the operation frequency of the electronic circuit. Incidentally, all the load circuits effectively operate when the wiring length Lt of the power source wiring is shorter than Le.

Figure 9B:
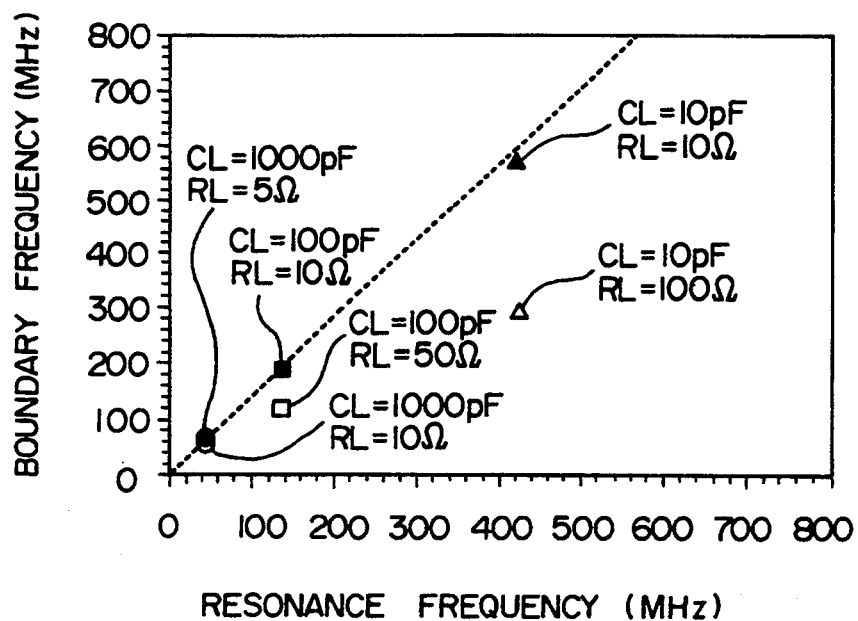
FIG. 9B is a diagram showing the relation of a boundary frequency and a resonance frequency when the power source wiring is handled as a concentrated constant circuit.

The boundary frequency fα at this time is determined by the inductance and the capacitance of the power source wiring within the range in which the load circuits remain effective for damping the noise, that is, within the distance Le in which the reflection wave occurring at the load point can return to the noise generation point within the time of ¼ of the noise cycle, and by the capacitance of the load circuits. The inductance within the distance Le and the capacitance of the load circuits can substantially be handled as concentrated constants. As shown in FIG. 9B, therefore, this boundary frequency fα is below about 1.4 of the resonance frequency fβ when the inductance and the capacitance falling within the distance Le are handled as the concentrated constants. In conjunction with the relation between the length of the power source wiring and the operation frequency, this resonance frequency fβ includes the following two cases, and can be expressed as follows:

(1) When the noise can reach only the distance Le expressed by the formula (11) within the time of ⅛ of the cycle of the operation frequency, that is, when the operation frequency $f_o$ is within the range of the formula (12), the resonance frequency fβ can be substantially expressed by the formula (13):

$$f_o > 1/(8 \cdot Lt \cdot \sqrt{(L \cdot C)}) \tag{12}$$

$$f\beta \approx 1/(2 \cdot \pi \cdot \sqrt{(Le \cdot L \cdot Ne \cdot CL)}) \tag{13}$$

(2) When the noise reaches the distal end of the power source wiring within the time of ⅛ of the cycle of the operation frequency, that is, when the operation frequency $f_o$ is within the range of the formula (14), the resonance frequency fβ can be substantially expressed by the formula (15):

$$f_o < 1/(8 \cdot Lt \cdot \sqrt{(L \cdot C)}) \tag{14}$$

$$f\beta \approx 1/(2 \cdot \pi \cdot \sqrt{(Lt \cdot L \cdot N \cdot CL)}) \tag{15}$$

Here, Lt is the wiring length of the power source wiring, L and C are the inductance and the capacitance of the power source wiring, CL is the capacitance of the load circuit, N is the total number of the load circuits disposed in the power source wiring, and Ne is the total number of the load circuits existing in the distance Le, in which the refelection wave occurring at the load point can return to the noise generation point within the time of ¼ of the cycle of the noise from the noise generation point.

Accordingly, the resistance elements and the capacitances of the load circuits may be set in such a manner that boundary frequency fα is below the operation frequency $f_o$ when the operation frequency of the electronic circuit is $f_o$, that is the resonance frequency fβ is below 1¼ times the operation frequency $f_o$, $$f_o > f\beta \cdot k \tag{16}$$

where k is set to 1.4.

When a plurality of noise generation points exist or in other words, when the number of load circuits existing within an effective distance from the electronic circuit for reducing the noise is different, the resistance element and the capacitance of the load circuit must be so set as to match with the case where the resonance frequency fβ attains the highest frequency, that is, where Ne becomes minimal, in order to cause the load circuit to effective operate in all cases.

Further, depending on the combination of the resistance RL and the capacitance CL, there is the case where the noise damping ratio is positive or in other words, where the noise is amplified, such as when the resonance frequency fβ is about 130 MHz with the resistance RL of the load circuit being 5Q and its capacitance being 1,000 pF, as represented by dash lines in FIG. 9A. This is because the impedance of the capacitance CL of the load circuit is higher than the resistance RL in this frequency band and consequently, the load circuits do not much contribute to the reduction of the noise. Accordingly, in-order to let the load circuits function in this frequency band and to render the noise damping ratio negative, the impedance of the capacitance CL must be lowered below the resistance RL. In other words, the resistance and the capacitance of the load circuit are so set as to satisfy the following relation (17):

$$RL > 1/(2 \cdot \pi \cdot f\beta \cdot CL) \tag{17}$$

Here, RL and CL are the resistance value and the resistance value of the load circuit, and $f\beta$ is the resonance frequency already described. In FIG. 9A, solid line represents the case where the resistance RL and the capacitance C are so set as to satisfy the formula (17), and satisfactory damping characteristics can be obtained in either case. So long as the resistance element and the capacitance of the load circuit satisfy the relation (17) at the operation frequency $f_o$ of the electronic circuit, the resonance frequency may be set to be below the operation frequency $f_o$ or in other words, in such a manner that k in the formula (16) becomes 1.0.

Further, when a plurality of noise generation points exist or in other words, when the number of load circuits existing within an effective distance from the electronic circuit for reducing the noise is different, the resistance RL of the load circuit must be so set as to match with the case where the resonance frequency $f\beta$ is the lowest, that is, Ne becomes maximal, in order to cause the load circuit to effectively operate.

After all, it can be understood by putting the formulas (11) to (17) in order that the resistance and the capacitance of the load circuit may be set to the following case (1) or (2).

(1) When the noise reaches only the distance Le of the power source wiring within the time of ⅛ of the cycle of the operation frequency as represented by the formula (11), that is, when the operation frequency $f_o$ exists within the range of the formula (12), they may be set as in the following case (1A) or (1B):

(1A)

$$RL > \pi \cdot ZO \cdot Ne,max/4 \quad (18)$$

and $$CL > 3.92/(\pi^2 \cdot ZO \cdot Ne,min) \quad (19)$$

or (1B)

$$RL > \pi \cdot ZO \cdot Ne,max/4 \quad (20)$$

and $$CL > 2/(\pi^2 \cdot ZO \cdot Ne,min) \quad (21)$$

(2) When the noise reaches the distal end of the power source wiring within the time of ⅛ of the cycle of the operation frequency, that is, when the operation frequency $f_o$ exists within the range of the formula (14):

(2A)

$$CL > 1.96/(2 \cdot \pi \cdot f_o \cdot \sqrt{(Lt \cdot L \cdot N)})^2 \quad (22)$$

and $$CL \cdot RL^2 < Lt \cdot L \cdot N \quad (23)$$

or (2B)

$$CL > 1/(2 \cdot \pi \cdot f_o \cdot \sqrt{(Lt \cdot L \cdot N)})^2 \quad (24)$$

and $$CL \cdot RL^2 > Lt \cdot L \cdot N \quad (25)$$

Here, Lt is the wiring length of the power source wiring, L and C are the inductance and the capacitance per unit length of the power source wiring, N is the total number of the load circuits, and Ne is the total number of the load circuits disposed within the distance Le from the noise generation point represented by the formula (11).

When a plurality of noise generation points exist or in other words, when the number of load circuits existing within an effective distance from the electronic circuit for reducing the noise, the value Ne,max in the formulas (18) and (20) must be set to the maximum value of the number of load circuits existing within an effective distance from the noise generation points for reducing the noise, while the value Ne,min in the formulas (19) and (21) must be set to the minimum value of the load circuits existing within an effective distance from the noise generation points for reducing the noise.

Furthermore, when the operation frequency $f_o$ is extremely high, there is the case where satisfactory damping characteristics cannot be obtained depending on the ratio of the resistance RL and the characteristic impedance ZO of the power source wiring even when the boundary frequency $f\alpha$ is set to be smaller than the operation frequency $f_o$.

Figure 4:
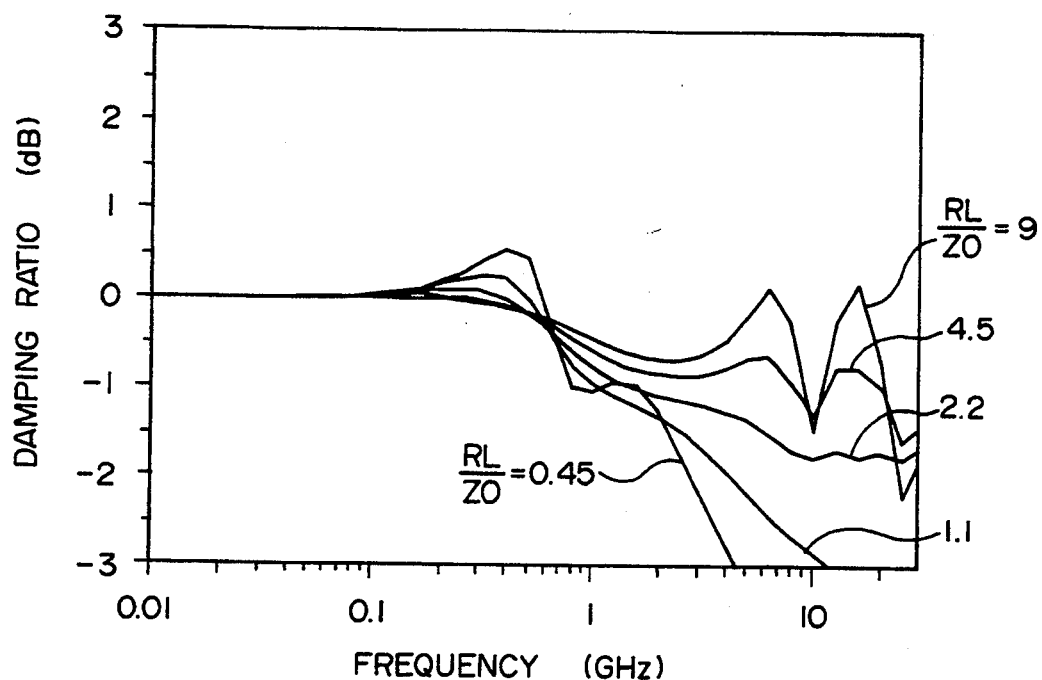
FIG. 4 is a diagram showing a noise damping ratio at a load junction point.

FIG. 4 shows the noise damping ratio for each frequency component of the noise at the junction 109 of the load circuit 105 using the ratio of the resistance value RL to the characteristic impedance ZO as a parameter.

Reference numeral 130 denotes the noise source and reference numeral 131 does an equivalent impedance of the noise source, which is hereby equal to the characteristic impedance. Reference numeral 132 denotes an equivalent impedance at the branch point 118 of the power source wiring, which is hereby equal to the characteristic impedance of the power source wiring. The capacitance of each load circuit 105, 107 is 10 pF. This diagram shows an example where the boundary frequency $f\alpha$ is set to approximately 500 MHz.

When the operation frequency $f_o$ is 6 GHz as shown in FIG. 4, for example, the reflection wave occurring at the junction of the load circuits drops with a greater resistance RL in a frequency band of about 10 GHz, though the boundary frequency $f\alpha$ is lower than the operation frequency f, so that the load circuits fail to function, the damping ration becomes smaller, and the noise is amplified in a certain frequency band.

It can be appreciated from the diagram that damping can be attained in any frequency band above several GHz within the range of the ratio $\alpha$ of the resistance RL to the characteristic impedance ZO of not greater than 4.5 times. In other words, it can be understood that the ratio $\alpha$ of the resistance RL to the characteristic impedance may be set to the range of up to 4.5 times. Though not shown in the drawing, it is effective to set the ratio $\alpha$ of the resistance RL to the characteristic impedance ZO to the range of from 4.5 to 5.0 times. Accordingly the ratio $\alpha$ of the resistance RL to the characteristic impedance ZO may be set to the range of not greater than 5.5 times.

FIGS. 3A and 3B show a structural example of the capacitance element when the noise reduction structure of the present invention is applied to the power source wiring system inside a semiconductor integrated circuit device. FIG. 3A is a plan view and FIG. 3B is a sectional view taken along a line A-A'.

In FIGS. 3A and 3B, a junction capacitance of the diode formed between an electrode 707 and an n-type ion implantation layer 702 is used as the capacitance element, whereas a diffusion resistance of a high concentration n-type ion implantation layer 702 is used as the resistance element. In this embodiment, the diode used as the capacitance element is fabricated by forming a high concentration n-type implantation layer 701, an n-type implantation layer 702 and a p-type implantation layer 703 on a semiconductor substrate 706. Reference numeral 705 denotes an insulating film for electrically insulating the power source wiring 101 from the electrode 707 and reference numeral 710 denotes an insulating film for insulating the substrate 706 from the electrode 708 and a metal layer 707. Reference numeral 711 denotes an insulating film for isolating the devices. The anode 707 of the diode is electrically connected to the substrate 707 by the high concentration p-type ion implantation layer 704. The cathode 708 is electrically connected to the power source wiring 101 through a through-hole 709. Here, the junction capacitance between the n-type implantation layer 702 and the p-type implantation layer 703 is used as the capacitance. The numerals 101, 707, 708, 709 are made of Al, for example. The numeral 710 is made of $SiO_2$, for example.

The explanation given above deals with the case where the load circuits 105, 106 and 107 are disposed within the arrival time range of about ½ of the noise pulse width or ¼ of the period of the noise frequency component. Needless to say, however, even when the load circuits are not disposed within this range, the voltage noise is damped at the junction of the load circuits due to mismatching of the impedance at the junction and consequently, the noise propagating to the adjacent electronic circuit 104 can be reduced. Particularly according to this structure, the power source wiring is cut off d.c.-wise from the ground potential by the capacitance 402 and the d.c. current does not flow through the load circuit 105. In other words, the increase of power consumption can be inhibited. Generally, the resistance element can be miniaturized much more than the capacitance element. Therefore, the present invention is particularly effective for a semiconductor integrated circuit having electronic circuits mounted thereto in a high mounting density. The effect of the present invention can be obtained likewise in a semiconductor integrated circuit of the type wherein the electronic circuits and the power source wirings are disposed irregularly, by disposing the afore-mentioned load circuits in the electronic circuits connected to the same power source wiring or between the electronic circuit groups.

In the explanation given above, the load circuits 105, 106 and 107 are disposed within the range of the arrival time range of about ½ of the noise pulse width. However, even though they are disposed outside this range, the voltage noise is damped at the junction of the load circuits due to mismatching of the impedance at this junction, and the noise propagating to the adjacent electronic circuit 104 can be reduced.

The construction of the present invention can be accomplished in a power source wiring system of an electronic circuit device having semiconductor integrated circuits on a printed circuit board, too, by using resistance elements and capacitance elements.

As described above, the present invention can reduce the voltage noise occurring in the power source wiring system due to the current noise at the time of the operation of the electronic circuit in the electronic circuit device having the electronic circuits mounted thereto in a high mounting density, can prevent the propagation of the voltage noise, and can effectively prevent the erroneous operation of the electronic circuit resulting from the voltage noise occurring in the power source wiring system.

We claim:

1. An electronic circuit device comprising:
   a plurality of electronic circuits;
   a common power source wiring connected to said plurality of electronic circuits at a plurality of junctions; and
   a plurality of series circuits for reducing noise, each of said series circuits including a resistance and a capacitance connected in series, wherein said plurality of series circuits are connected to said power source wiring between adjacent junctions at which adjacent electronic circuits are respectively connected to said power source wiring;
   wherein assuming conditions of the operation frequency $f_o$ of said adjacent electronic circuits, a wiring length $L_t$ of said power source wiring, an inductance L and a capacitance C per unit length of said power source wiring, a characteristic impedance ZO of said power source wiring, and a smaller number Ne,min of said series circuits and a greater number Ne,max of said series circuits among the total number of said series circuits disposed within the range of distance $1/(8 \cdot f_o \cdot \sqrt{(L \cdot C)})$ from each of said adjacent electronic circuits,
   when the operation frequency $f_o$ of said adjacent electronic circuits is in the following relation $$f_o > 1/(8 \cdot L_t \sqrt{(L \cdot C)}),$$

then values of RL and CL of the resistance and the capacitance of said each series circuit satisfy the following relations $$RL < \pi \cdot ZO \cdot Ne,max/4, \text{ and}$$

$$CL > 3.92/(\pi^2 \cdot ZO \cdot Ne,min), \text{ and}$$

wherein said plurality of electronic circuits, said power source wiring and said plurality of series circuits are formed on a surface of a common semiconductor substrate.

2. An electronic circuit device comprising:
   a plurality of electronic circuits;
   a common power source wiring connected to said plurality of electronic circuits at a plurality of junctions; and
   a plurality of series circuits for reducing noise, each of said series circuits including a resistance and a capacitance connected in series, wherein said plurality of series circuits are connected to said power source wiring between adjacent junctions at which adjacent electronic circuits are respectively connected to said power source wiring;
   wherein assuming conditions of the operation frequency $f_o$ of said adjacent electronic circuits, a wiring length $L_t$ of said power source wiring, an inductance L and a capacitance C per unit length of said power source wiring, characteristic impedance ZO of said power source wiring, and a smaller number Ne,min of said series circuits and a greater number Ne,max of said series circuits among the total number of said series circuits disposed within the range of $1/(8 \cdot f_o \cdot \sqrt{(L \cdot C)})$ from each of said adjacent electronic circuits, when the operation frequency $f_o$ of said adjacent electronic circuits is in the following relation $$f_o > 1/(8 \cdot L_t \sqrt{(L \cdot C)}),$$

then values of RL and CL of the resistance and the capacitance of said each series circuit satisfy the following relations $$RL > \pi \cdot ZO \cdot Ne, max/4, \text{ and}$$

$$CL > 2/(\pi^2 \cdot ZO \cdot Ne, min), \text{ and}$$

wherein said plurality of electronic circuits, said power source wiring and said plurality of series circuits are formed on a surface of a common semiconductor substrate.

3. An electronic circuit device comprising:
a plurality of electronic circuits;
a common power source wiring connected to said plurality of electronic circuits at a plurality of junctions; and
a plurality of series circuits for reducing noise, each of said series circuits including a resistance and a capacitance connected in series, wherein said plurality of series circuits are connected to said power source wiring between adjacent junctions at which adjacent electronic circuits are respectively connected to said power source wiring;
wherein assuming conditions of the number N of said series circuits connected to said power source wiring between said adjacent electronic circuits, the operation frequency $f_o$ of said adjacent electronic circuits, a wiring length $L_t$ of said power source wiring, and an inductance L and a capacitance C per unit length of said power source wiring,
when the operation frequency $f_o$ of said adjacent electronic circuits is in the following relation $$f_o < 1/(8 \cdot L_t \sqrt{/(L \cdot C)}),$$

then values of RL and CL of the resistance and the capacitance of said each series circuit satisfy the following relations $$CL > 1.96/(2 \cdot \pi \cdot f_o \cdot \sqrt{(L_r L \cdot N)})^2, \text{ and}$$

$$CL \cdot RL^2 < L_r L \cdot N, \text{ and}$$

wherein said plurality of electronic circuits, said power source wiring and said plurality of series circuits are formed on a surface of a common semiconductor substrate.

4. An electronic circuit device comprising:
a plurality of electronic circuits;
a common power source wiring connected to said plurality of electronic circuits at a plurality of junctions; and
a plurality of series circuits for reducing noise, each of said series circuits including a resistance and a capacitance connected in series, wherein said plurality of series circuit are connected to said power source wiring between adjacent junctions at which adjacent electronic circuits are respectively connected to said power source wiring;
wherein assuming conditions of the number N of said series circuits connected to said power source wiring between said adjacent electronic circuits, the operation frequency $f_o$ of said adjacent electronic circuits, the wiring length $L_t$ of said power source wiring, and an inductance L and a capacitance C per unit length of said power source wiring,
when the operation frequency $f_o$ of said adjacent electronic circuits is in the following relation $$f_o < 1/(8 \cdot L_t \sqrt{(L \cdot C)}),$$

then values of RL and CL of the resistance and the capacitance of said each series circuit satisfy the following relations $$CL > 1/(2 \cdot \pi \cdot f_o \cdot \sqrt{(L_r L \cdot N)})^2, \text{ and}$$

$$CL \cdot RL^2 > L_r L \cdot N, \text{ and}$$

wherein said plurality of electronic circuits, said power source wiring and said plurality of series circuits are formed on a surface of a common semiconductor substrate.

5. An electronic circuit device comprising:
a plurality of electronic circuits;
a common power source wiring connected to said plurality of electronic circuits at a plurality of junctions; and
a plurality of series circuits for reducing noise, each of said series circuits including a resistance and a capacitance connected in series, wherein said plurality of series circuits are connected to said power source wiring between adjacent junctions at which adjacent electronic circuits are respectively connected to said power source wiring;
wherein a resistance value of said resistance is at least ½ times and not greater than 5.5 times a characteristic impedance of said power source wiring, and
wherein said plurality of electronic circuits, said power source wiring and said plurality of series circuits are formed on a surface of a common semiconductor substrate.

* * * * *